US010637384B2

(12) United States Patent
Eke

(10) Patent No.: US 10,637,384 B2
(45) Date of Patent: Apr. 28, 2020

(54) APPARATUS AND METHOD FOR CONTROLLING AN OSCILLATING DEVICE

(71) Applicant: Dialog Semiconductor (UK) Limited, London (GB)

(72) Inventor: David Eke, Dalkeith (GB)

(73) Assignee: Dialog Semiconductor (UK) Limited, London (GB)

( * ) Notice: Subject to any disclaimer, the term of this patent is extended or adjusted under 35 U.S.C. 154(b) by 72 days.

(21) Appl. No.: 15/464,623

(22) Filed: Mar. 21, 2017

(65) Prior Publication Data
US 2018/0159457 A1 Jun. 7, 2018

(30) Foreign Application Priority Data
Dec. 6, 2016 (GB) .................................. 1620746.6

(51) Int. Cl.
*H02P 25/032* (2016.01)
*H02P 7/03* (2016.01)
*H02P 6/182* (2016.01)
*H02P 6/28* (2016.01)
*H03L 5/00* (2006.01)
*H03L 7/099* (2006.01)
*G08B 6/00* (2006.01)

(52) U.S. Cl.
CPC .............. *H02P 25/032* (2016.02); *G08B 6/00* (2013.01); *H02P 7/04* (2016.02); *H03L 5/00* (2013.01); *H03L 7/099* (2013.01); *H02P 6/182* (2013.01); *H02P 6/28* (2016.02)

(58) Field of Classification Search
CPC ............................... H02P 6/182; H02P 25/032
See application file for complete search history.

(56) References Cited

U.S. PATENT DOCUMENTS

| 6,865,064 | B2 * | 3/2005 | Miyajima | ............ | G02B 26/085 |
| | | | | | 361/152 |
| 9,121,753 | B2 * | 9/2015 | Cahill | .................... | G01H 13/00 |
| 9,467,085 | B1 * | 10/2016 | Murata | ................. | H02P 25/026 |
| 9,785,117 | B2 * | 10/2017 | Kawaguchi | ............. | G04C 3/14 |

(Continued)

OTHER PUBLICATIONS

Anne Driemel, "Multiscale Curvature Matching for Smooth Polylines", 2009, pp. 1-6 (Year: 2009).*

(Continued)

*Primary Examiner* — Bickey Dhakal
(74) *Attorney, Agent, or Firm* — Saile Ackerman LLC; Stephen B. Ackerman

(57) ABSTRACT

An apparatus and method for stopping a linear resonant actuator is presented. A control system for use with an oscillating device has a response signal having a back electromotive force component and a driver adapted to provide a drive signal to the oscillating device. The control system has a sensor adapted to sense an electrical parameter of the response signal and a controller coupled to the sensor and to the driver. The controller has a calculator adapted to determine a sign of curvature of a portion of the response signal based on the electrical parameter, and the controller is adapted to provide a control signal to adjust the amplitude of the drive signal to slow down the oscillating device, and withdraw the drive signal upon identifying a change in the sign of curvature.

19 Claims, 9 Drawing Sheets

(56) References Cited

U.S. PATENT DOCUMENTS

| | | | | |
|---|---|---|---|---|
| 2015/0137713 A1* | 5/2015 | Barsilai | ................ | H02P 25/032 |
| | | | | 318/114 |
| 2015/0204925 A1* | 7/2015 | Hernandez | ............. | G01R 27/02 |
| | | | | 702/65 |
| 2017/0063273 A1* | 3/2017 | Murata | ................... | H02P 25/06 |

OTHER PUBLICATIONS

U.S. Appl. No. 15/464,547, filed Mar. 21, 2017, "An Apparatus and Method for Controlling an Oscillating Device," by David Eke et al., 43 pgs.

* cited by examiner

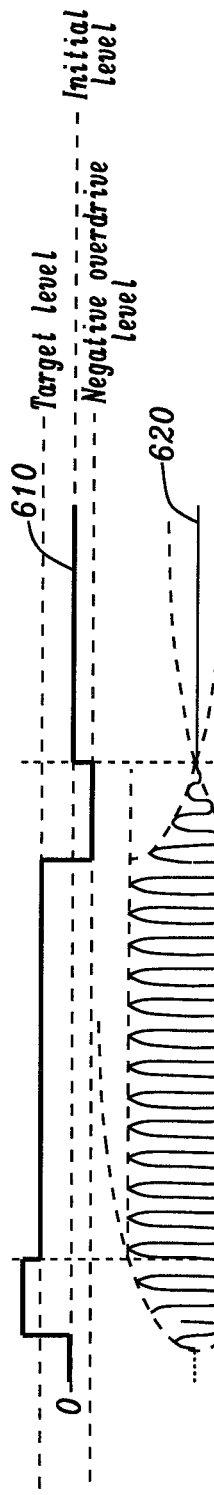
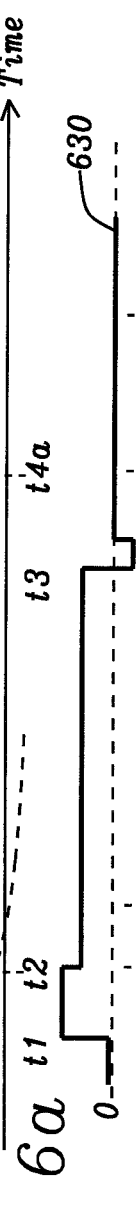
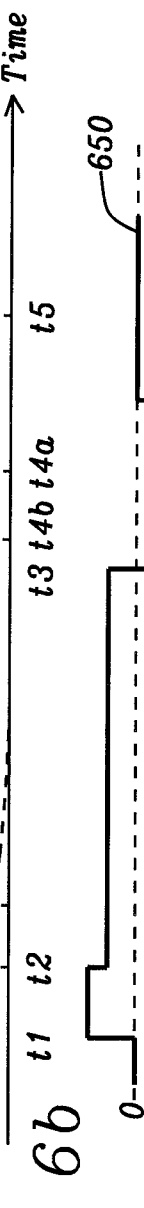
FIG. 6a
FIG. 6b
FIG. 6c

APPARATUS AND METHOD FOR CONTROLLING AN OSCILLATING DEVICE

This application is related to U.S. patent application Ser. No. 15/464,547, filed on Mar. 21, 2017, which is owned by a common assignee, and which is herein incorporated by reference in its entirety.

TECHNICAL FIELD

The present disclosure relates to an apparatus and methods for controlling an oscillating device. In particular, the present invention relates to an apparatus and method for stopping a linear resonant actuator.

BACKGROUND

Oscillating devices which may include haptic actuators, speakers and crystal oscillators are used in a variety of products. Haptic actuators are commonly used with electronic devices to provide the user with a sensory signal also referred to as haptic feedback. For example, mobile phones are often equipped with a haptic actuator which vibrates to provide a notification for a user upon the arrival of a text message or other similar event. To this end different types of haptic actuators have been developed, among which are the linear resonant actuator, LRA, and piezo-electric actuators.

LRAs are based on an inductive coil (solenoid) coupled to a spring holding a permanent magnet. In operation, the spring and mass system move along a single axis. When a current is passing in one direction through the coil it creates a magnetic field that repels the magnet. When passing the current in the other direction the magnetic field attracts the magnet. Hence, the transfer of energy between the spring and the coil generates oscillations. The system has a mechanical resonance frequency typically in the range of 50-300 Hz. At the resonant frequency, the push-pull drive voltage produces the maximum linear deviation of the sprung mass.

Following Lenz's law, upon oscillation of the mass, a back electromotive force, BEMF, is generated across the actuator that opposes the voltage of the source that created it. When the mass moves through the coil it follows a simple harmonic motion, which causes it to induce a sinusoidal voltage in the solenoid. This BEMF is strongest at the resonance frequency of the system. The BEMF is proportional in the first order to a drive signal driving the LRA. However, the BEMF amplitude is dependent on the weight and strength of the magnet and the number of turns of the solenoid coil. This means that the BEMF varies across LRAs and across temperature and other electro-mechanical parameters.

The mass of the LRA can be accelerated or decelerated by varying the parameters of a drive signal driving the actuator such as the amplitude and the phase of the signal. In this way, a desired user feedback can be achieved. However, the LRA does not respond immediately to a change in amplitude of the drive signal but instead provides a low-pass filter. The rate of acceleration is proportional to the driving power. Hence, it is possible to improve the response of the LRA by overdriving it for a short period of time.

Current practice uses overdriving to accelerate and retard the LRA's oscillations. The level to which a system can be overdriven will depend on the characteristics of the LRA including its resonant impedance, and response time. However, while overdriving allows the LRA to reach a desired amplitude of oscillation more quickly, it is often difficult to know when to stop the overdriving. This is a particular issue when trying to stop the oscillation of the LRA altogether. If the level of overdrive is too large or applied for too long, then the LRA will be decelerated passed the stop level.

Current approaches require calibrating the system for a specific haptic actuator based on its BEMF response, so that the haptic actuator response to a particular level of driving signal is known. This limits the use of the system to a specific actuator and requires a relatively complex system.

SUMMARY

It is an object of the invention to address one or more of the above-mentioned limitations. According to a first aspect of the disclosure there is provided a control system for use with an oscillating device comprising a response signal having a back electromotive force component, the control system comprising a driver adapted to provide a drive signal to the oscillating device; wherein the drive signal comprises an amplitude; a sensor adapted to sense an electrical parameter of the response signal; and a controller coupled to the sensor and to the driver, the controller comprising a calculator adapted to determine a sign of curvature of a portion of the response signal based on the electrical parameter; the controller being adapted to provide a control signal to adjust the amplitude of the drive signal to slow down the oscillating device, and withdraw the drive signal upon identifying a change in the sign of curvature. For example, the oscillating device may be a haptic actuator such as an LRA.

Optionally, the drive signal comprises a polarity, and the controller is adapted to slow down the oscillating device by reversing the polarity of the drive signal.

Optionally, identifying a change in the sign of curvature comprises identifying a change from a negative curvature to a positive curvature.

Optionally, identifying a change in the sign of curvature comprises identifying that the portion of the response signal has a zero curvature. For example, the portion of the response signal may be substantially flat.

Optionally, the sensor may be adapted to sense the electrical parameter at a plurality of sampling times associated with a sampling pattern to obtain a first measurement, a second measurement and a third measurement; and wherein the calculator is adapted to compare the second and third measurements with the first measurement, and to determine the sign of curvature based on the comparison.

Optionally, wherein the oscillating device comprises a resonance frequency, the control system comprising a frequency controller adapted to adjust the drive signal to drive the oscillating device at the resonance frequency.

Optionally, wherein the driver is a current driver to provide a current signal, and wherein the sensor is a voltage sensor to sense a voltage across the oscillating device.

According to a second aspect of the disclosure there is provided a method of controlling an oscillating device adapted to provide a response signal comprising a back electromotive force component, the method comprising providing a drive signal to drive the oscillating device, wherein the drive signal comprises an amplitude; sensing an electrical parameter of the response signal; adjusting the amplitude of the drive signal to slow down the oscillating device; determining a sign of curvature of a portion of the response signal based on the electrical parameter; and withdrawing the drive signal upon identifying a change in the sign of curvature.

Optionally, wherein the drive signal comprises a polarity, and wherein adjusting the amplitude of the drive signal to slow down the oscillating device comprises reversing the polarity of the drive signal.

Optionally, wherein identifying a change in the sign of curvature comprises identifying a change from a negative curvature to a positive curvature.

Optionally, wherein identifying a change in the sign of curvature comprises identifying that the portion of the response signal has a zero curvature.

Optionally, wherein determining the sign of curvature comprises sensing the electrical parameter at a plurality of sampling times to obtain a first measurement, a second measurement and a third measurement; comparing the second and third measurements with the first measurement; and determining the sign of curvature based on the comparison.

Optionally, wherein the oscillating device comprises a resonance frequency, the method comprising adjusting the drive signal to drive the oscillating device at the resonance frequency.

Optionally, wherein the drive signal is a current signal and wherein the electrical parameter is a voltage.

According to a third aspect of the disclosure, there is provided an oscillating device system comprising an oscillating device comprising a response signal having a back electromotive force component, and a control system, the control system comprising a driver adapted to provide a drive signal to the oscillating device; wherein the drive signal comprises an amplitude; a sensor adapted to sense an electrical parameter of the response signal; and a controller coupled to the sensor and to the driver, the controller comprising a calculator adapted to determine a sign of curvature of a portion of the response signal based on the electrical parameter; the controller being adapted to provide a control signal to adjust the amplitude of the drive signal to firstly slow down the oscillating device, and secondly withdraw the drive signal upon identifying a change in the sign of curvature.

According to a fourth aspect of the disclosure, there is provided a mobile device comprising an oscillating device system; the oscillating device system comprising an oscillating device comprising a response signal having a back electromotive force component, and a control system, the control system comprising a driver adapted to provide a drive signal to the oscillating device; wherein the drive signal comprises an amplitude; a sensor adapted to sense an electrical parameter of the response signal; and a controller coupled to the sensor and to the driver, the controller comprising a calculator adapted to determine a sign of curvature of a portion of the response signal based on the electrical parameter; the controller being adapted to provide a control signal to adjust the amplitude of the drive signal to firstly slow down the oscillating device, and secondly withdrawing the drive signal upon identifying a change in the sign of curvature.

According to a fifth aspect of the disclosure, there is provided a controller for use with a driver for providing a drive signal to an oscillating device, and a sensor for sensing an electrical parameter of a response signal of the oscillating device, the controller comprising a calculator adapted to determine a sign of curvature of a portion of the response signal based on the electrical parameter; the controller being adapted to provide a control signal to adjust an amplitude of the drive signal to slow down the oscillating device, and withdraw the drive signal upon identifying a change in the sign of curvature.

Optionally, the response signal comprises a back electromotive force component.

Optionally, the drive signal comprises a polarity, and wherein the controller is adapted to slow down the oscillating device by reversing the polarity of the drive signal.

Optionally, identifying a change in the sign of curvature comprises identifying a change from a negative curvature to a positive curvature.

Optionally, identifying a change in the sign of curvature comprises identifying that the portion of the response signal has a zero curvature.

Optionally, the calculator may be adapted to receive a first measurement, a second measurement and a third measurement of the electrical parameter; wherein the measurements are obtained at a plurality of sampling times; and wherein the calculator is adapted to compare the second and third measurements with the first measurement and to determine the sign of curvature based on the comparison.

Optionally, the controller comprises a selector coupled to the calculator, for selecting a level of the drive signal.

BRIEF DESCRIPTION OF THE DRAWINGS

The invention is described in further detail below by way of example and with reference to the accompanying drawings, in which:

FIG. 6a is a time chart showing the variation of a BEMF signal when the haptic actuator is controlled with a negative overdrive having an ideal duration;

FIG. 6b is a time chart showing the variation of a BEMF signal when the haptic actuator is controlled with a negative overdrive that is too short;

FIG. 6c is a time chart showing the variation of a BEMF signal when the haptic actuator is controlled with a negative overdrive that is too long;

DESCRIPTION

Figure 1:
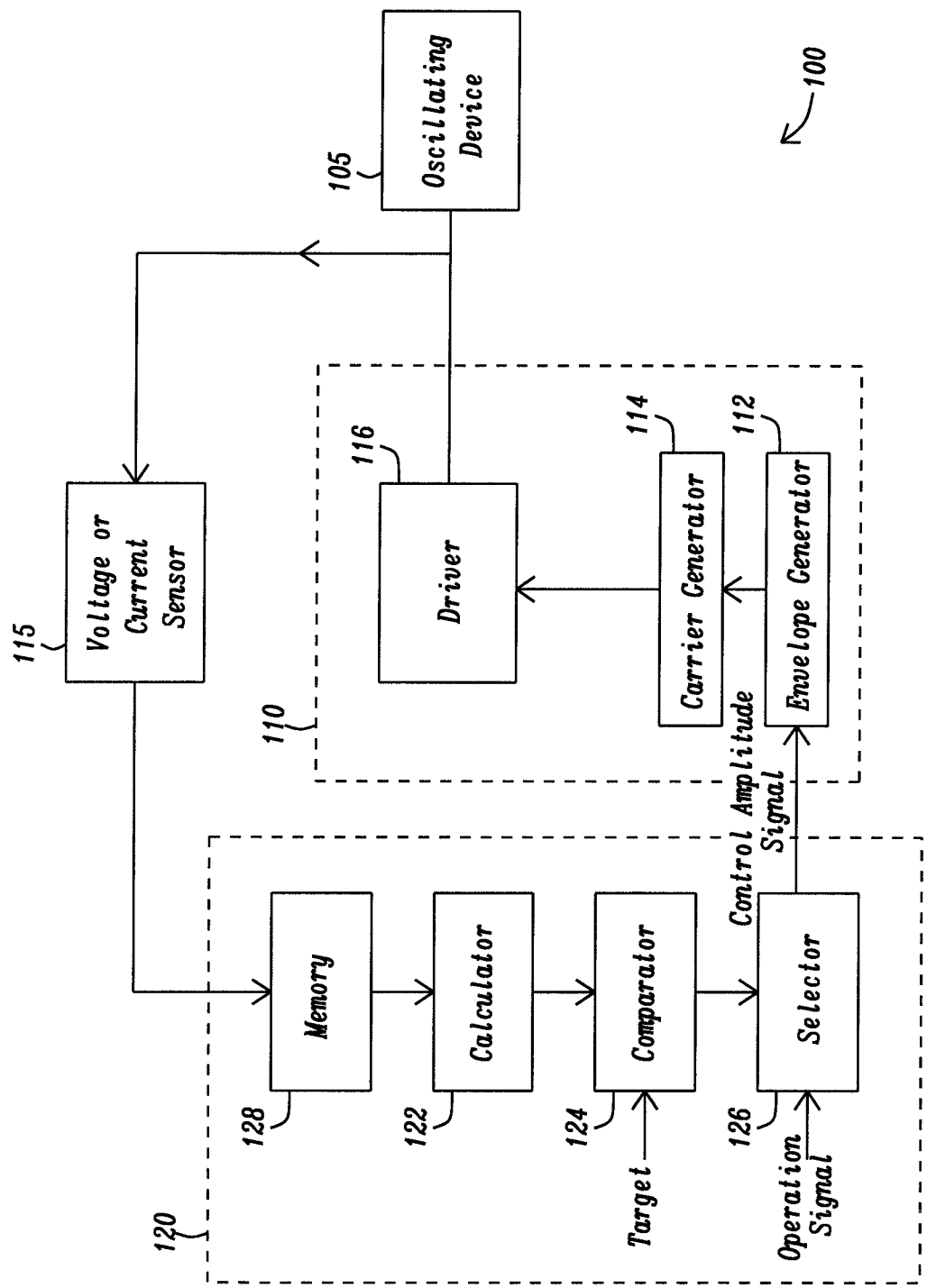
FIG. 1 is a diagram of an oscillating-device system.

FIG. 1 illustrates an oscillating system 100. The system includes an oscillating device 105, a regulator 110, a sensor 115 and a controller 120.

The oscillating device 105 may be any device arranged to provide inductive or capacitive oscillations. The oscillating device can also be a mechanical arrangement including a sprung magnet. For example, the oscillating device may be a speaker, a crystal oscillator, or a haptic actuator such as a linear resonant actuator LRA.

The regulator 110 may be a current regulator or a voltage regulator. The regulator 110 has an input for receiving a control signal from the controller 120 and an output for providing a drive signal such as a drive current signal or a drive voltage signal to the haptic actuator 105. The regulator 110, is adapted to adjust the drive signal using the control signal from the controller 120.

The sensor 115 is coupled between the oscillating device 105 and the controller 120. The sensor 115 may be a voltage sensor or a current sensor and is adapted to sense an electrical parameter. The electrical parameter is associated with a system waveform which may be a voltage waveform or a current waveform. The sensed electrical parameter may be for example a direct voltage or a representation of the voltage such as a filtered value of the voltage. In another example the sensed electrical parameter may be a direct current or a representation of the current such as a filtered value of the current. The sensor 115 can be implemented in different fashions. For instance, the sensor 115 can be implemented with a preamplifier coupled to an analogue to digital converter ADC.

The controller 120 is coupled to the regulator 110 and to the sensor 115. The controller includes a memory 128 also referred to as register, a calculator 122, a comparator 124 and a selector 126 also referred to as drive level selector.

The controller 120 may be implemented as a digital controller or an analog controller.

The memory 128 has an input for receiving an electric parameter value from the sensor 115, and an output coupled to the calculator 122. The memory may be implemented as a digital register or as a plurality of sample and hold capacitors. The calculator 122 has an input for receiving the electrical parameter value or measurement from the memory 128 or directly from the sensor 115, and an output for providing a difference or a slope value between a plurality of measurements. The calculator 122 is adapted to determine a curvature of a portion of the response signal based on the electrical parameter. The calculator 122 may be a subtractor or a slope calculator to calculate a slope or gradient between two points.

The comparator 124 has a first input for receiving the difference or slope value from the calculator 122 a second input for receiving a target value and an output for providing a control signal to select a drive level. For example, the comparator 124 receives a difference between two values and compares the difference with the target. The target may be a zero-reference value to determine if the difference is positive or negative. The comparator 124 can be implemented as a subtractor.

The calculator 122 and the comparator 124 may be implemented as a digital or an analog circuit. For example, the calculator 122 and comparator 124 may be implemented as two comparator amplifiers. In an alternative embodiment, the calculator 122 and comparator 124 may be a single digital calculator.

The drive level selector 126 has an input for receiving the control signal from the comparator 124 and an output for providing a control signal to the regulator 110. The selector 126 may be coupled to a plurality of drive levels (not shown). On receipt of the control signal, the selector 126 is adapted to select one of a plurality of drive levels. For instance, the selector may be adapted to select one of a positive level, a target level, an initial level, and a negative overdrive level also referred to as stopping level. The stopping level may depend on the limit of the electrical supplies for the system or the tolerance of the oscillating device. For instance, the stopping level may be a negative rail voltage or a current generated from the negative rail voltage. The drive level selector 126 may be implemented as a multiplexer.

Optionally, the selector 126 may also include an input for receiving an operation signal. The operation signal may be a signal to start or stop the oscillating device 105 depending on a specific circumstance. When considering the example of a mobile phone, the operating signal may for instance be triggered by an incoming call or message. Alternatively, the operating signal may be triggered by the user touching the screen or keyboard of the mobile phone. The control signal includes an amplitude parameter for changing an amplitude of the envelope signal generated by the envelope generator 112. The control signal may be used to reverse the polarity of the drive signal to brake the oscillating device. For example, if the drive signal is a drive current, an active overdrive can be accomplished by adjusting the amplitude (DC level) of the current signal. Braking can be achieved by changing a positive amplitude into a negative amplitude which inverts the phase of the drive current signal. The control signal may also be used to reduce the amplitude of the drive signal to zero hence effectively withdrawing the drive signal.

The regulator 110 comprises an envelope generator 112, a carrier generator 114 and a driver 116, such as a current driver or voltage driver. The envelope generator 112 has an input for receiving the control signal from the control loop 126. The carrier generator 114 has an input for receiving an amplitude parameter from the envelope generator 112 and an output for providing a signal to the driver. The driver 116 has an input for receiving a signal from the carrier generator 114 and an output for proving a drive signal to the haptic actuator 105. In operation, the carrier generator 114 receives the output from the envelope generator 112 to control the amplitude of its output signal. The driver 116 then receives the output from the carrier generator and provides a suitable current or voltage to the oscillating device. The regulator 110 may be implemented in different fashions. For example, a current regulator may comprise a current driver such as a differential H-bridge, coupled to a current control loop. The current control loop may use for example a PWM or a linear control technique.

Figure 2:
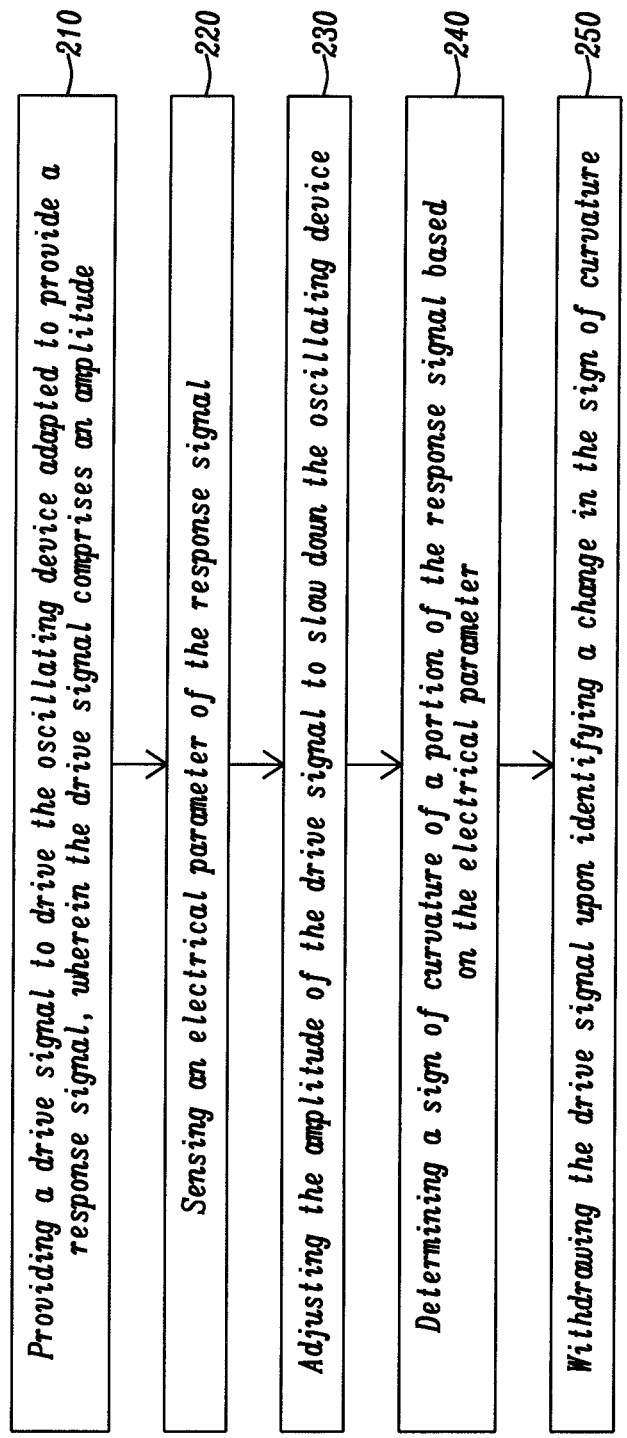
FIG. 2 is a flow diagram of a method for braking an oscillating device.

FIG. 2 shows the step of a method for braking an oscillating device providing a response signal, using the system of FIG. 1.

At step 210, a drive signal is provided by the regulator 110 to drive the oscillating device 105. The drive signal has an amplitude, a polarity and a drive frequency. The regulator 110 can for example provide a current drive signal or a voltage drive signal.

At step 220, an electrical parameter of the response signal is sensed by the sensor 115. For instance, the sensor 115 senses a voltage across the oscillating device.

At step 230, the amplitude of the drive signal is adjusted to slow down the oscillating device. The polarity of the drive signal may be reversed, to brake the oscillating device. This may be achieved by selecting a negative overdrive signal. For instance, the controller 120 from FIG. 1, generates a control signal to reverse the amplitude of the drive signal at a particular period.

At step 240, the controller 120 determines a sign of curvature of a portion of the response signal based on the electrical parameter. The sign of curvature may be positive, negative or null. For example, the controller 120 determines a shape of the waveform in a region located around a maximum or a minimum of the waveform. This can be achieved by collecting three measurements on the waveform, for example a first point S1 located around the maximum (or minimum) of the waveform and two other points S2 before S1 and S3 after S1. The sensor 115 may send a plurality of sample points to the memory 112. The calculator 122 can then calculate a difference or a slope between S1, S2 and S1, S3 to identify the sign of curvature in a region of the response signal. For example, in a positive half-cycle of the response signal, the calculator may be adapted to verify if the following inequalities i) S1>S2 and ii) S1>S3 are satisfied. If i) and ii) are true, then the waveform is convex and if both i) and ii) are false then the signal is concave. If only one of i) or ii) is true, then the drive signal is not in phase with the response signal. In a preferred embodiment, the control system should be locked in frequency such that the drive signal is in phase with the response signal. When the measurements are performed in the negative half-cycle, the measurements may be rectified.

At step 250, the drive signal is withdrawn upon identifying a change in the sign of curvature of the portion of the response signal. For instance, if the controller 120 has a curvature that is initially negative (concave), the controller may provide a control signal to stop the drive signal when the curvature just starts to becomes positive (convex). This may be performed at a time when the curvature is null (flat). Withdrawing the drive signal could be achieved by reducing the amplitude of the drive signal to zero.

This approach provides a simple, flexible and low-power method of actively stopping the oscillations of an oscillating device. The method is compatible with different oscillating devices and does not require calibrating the device's response to a specific driving signal. The response time for stopping the oscillating device is also reduced, without significantly increasing the complexity of the system. When the oscillating device is driven with a current signal, the above method can be applied while driving the device. Hence no interruption of the driving signal is required until the oscillating device has actually stopped.

Figure 3:
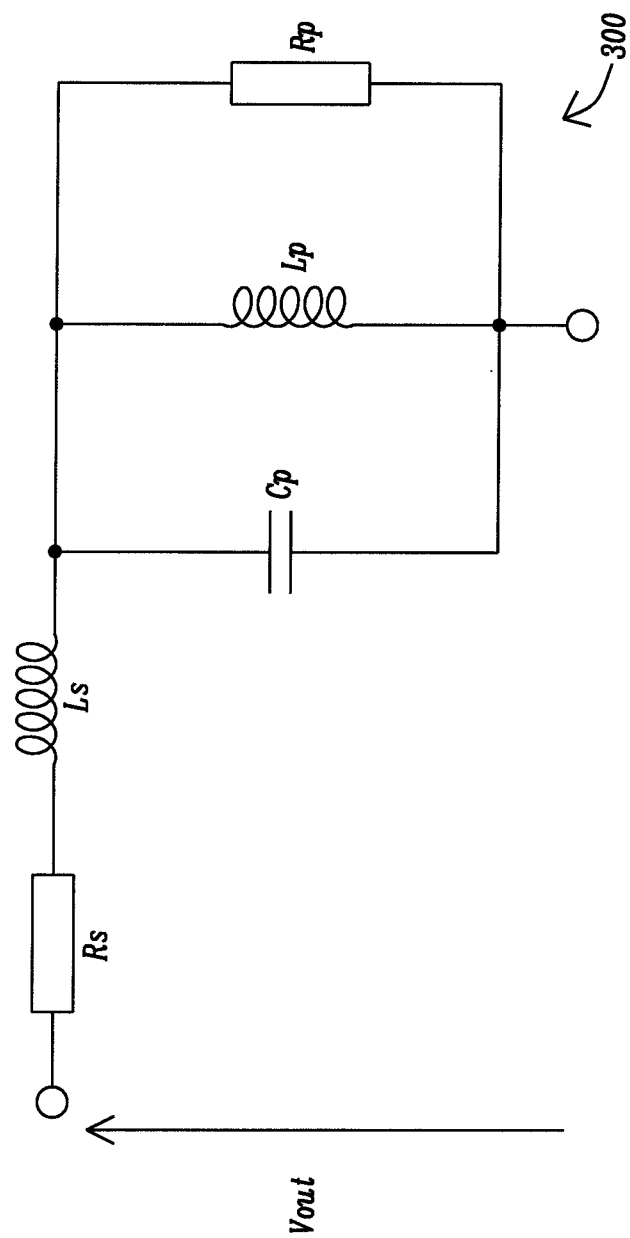
FIG. 3 is an electrical system for modelling a linear resonance actuator.

FIG. 3 shows an electrical system 300 for modelling an LRA. The LRA is modelled as a first resistor Rs in series with a first inductor Ls combined with a second resistor Rp in parallel with a second inductor Lp and a capacitor Cp. The damped oscillating motion of the system formed by the spring and the magnetic mass of the LRA is represented by the components Rp, Lp and Cp. The components Rs and Ls are used to represent the electrical behavior of the internal coils (solenoid) used to attract and repel the mass of the LRA.

The circuit will resonate at a frequency primarily dependent on the values of Cp and Lp. Providing the filtering effect of Rs and Ls is significantly above the resonance of the circuit then the current and voltage at resonance will be dependent purely of the sum of the resistances Rs and Rp. When driven with a drive signal approaching the resonant frequency, a LRA will resonate and produce a back electromotive force, BEMF, proportional in amplitude to the drive signal. The amplitude will build up following a low-pass filter response describing an exponential decay tending towards the final value.

Figure 4:
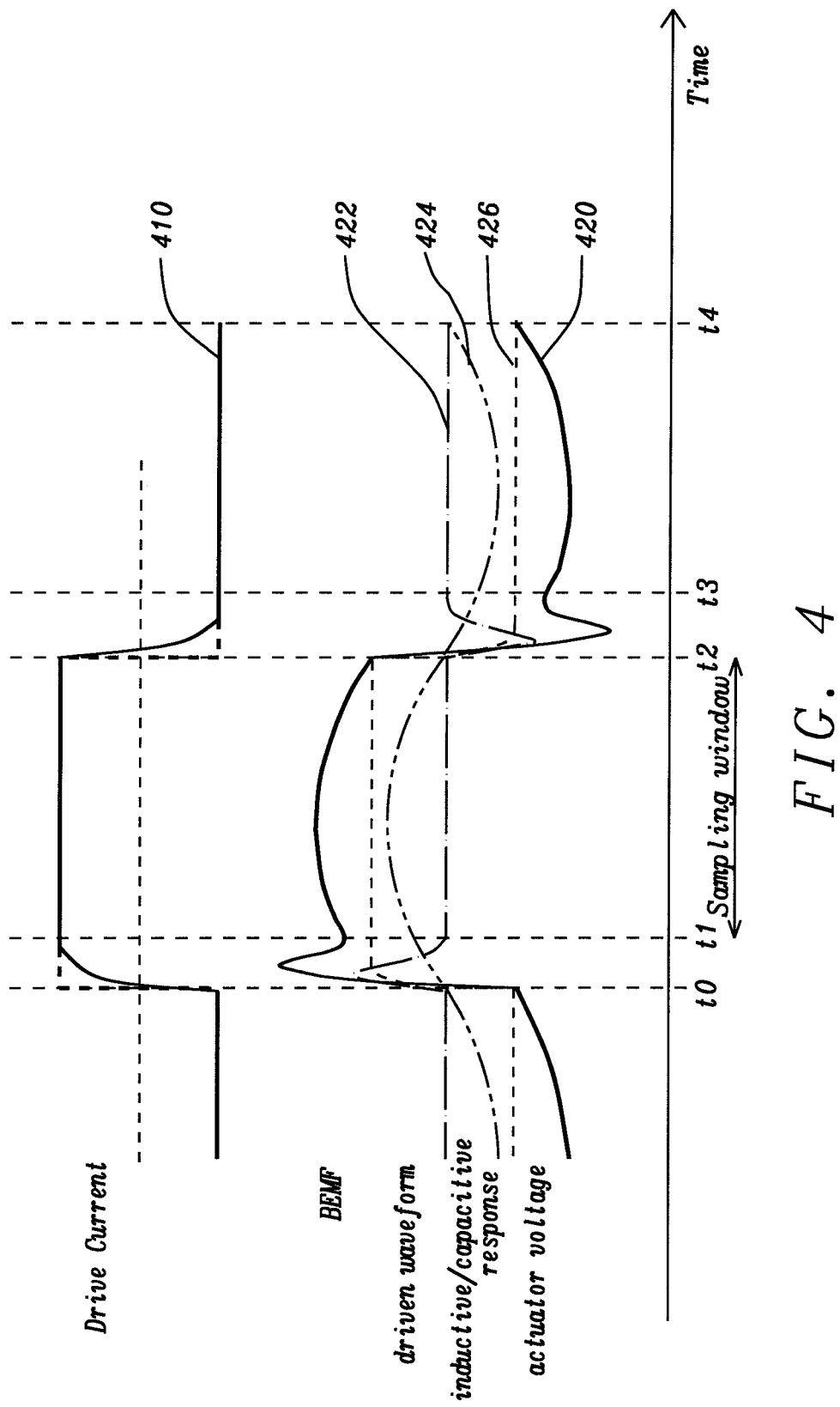
FIG. 4 is a time chart showing the waveforms of a drive signal and a response signal of a haptic actuator.

FIG. 4 shows the waveforms of a drive signal 410, and a response signal 420, also referred to as output voltage Vout. The response signal 420 comprises an inductive component 422, a BEMF component 424, and a drive signal component 426.

In this example, the drive signal 410 is current drive signal having a square wave profile. For example, the output current may change polarity between −50 mA and +50 mA. The dotted line represents the intended drive waveform, and the solid line represent the current as it appears across the actuator due to RC effects. FIG. 4 represents operation of the LRA at or near resonance. In this regime of operation, the current signal 410 changes polarity, at a frequency that is equal or close to the resonant frequency of the haptic actuator. Thus, the back-EMF voltage 424 is in phase with the current drive signal 410. If the haptic actuator were driven with an off-frequency, then the shape of the system waveform 420 would change as the BEMF signal 424 becomes out of phase with the drive signal 410.

The output voltage $V_{out}$ 420 across the LRA can be expressed by equation (1) as:

$$V_{out} = IR + \frac{Ldi}{dt} + V_{BEMF},$$

where I is the current drive, R is the resistance of the vibrator, L is the inductance of the LRA and $V_{BEMF}$ is the back-EMF voltage.

A drive period extends between the times t0 and t4. At time t0, the current drive 410 starts increasing. Between the times t0 and t1, the current 410 increases from a negative current value to a positive current value. During this time the di/dt component of $V_{out}$ is positive. The output voltage 420 shows a sharp positive spike.

At time t1 the current drive 410 has reached its most positive value. Between times t1 and t2, the current drive 410 remains substantially constant. During this time the di/dt component of $V_{out}$ is zero or close to zero. The IR component of $V_{out}$ is a positive constant value. Therefore, the output voltage 420 corresponds to a positive DC component (IR) added to a positive $V_{BEMF}$ component.

At time t2 the current drive 410 starts decreasing. Between the times t2 and t3, the current decreases from a positive current value to a negative current value. During this time the di/dt component of $V_{out}$ is negative.

At time t3 the current drive 410 has reached its most negative value. Between times t3 and t4, the current drive 410 remains substantially constant. During this time the di/dt component of $V_{out}$ is zero or close to zero. The IR component of $V_{out}$ is a negative constant value. Therefore, the output voltage 420 corresponds to a negative DC component (IR) added to a negative $V_{BEMF}$ component.

The output voltage is typically not measured during the time windows t1-t0 and t3-t2, as any measurement performed during these time windows would be corrupted by the settling behaviour of the current regulator and the voltage sensor. Instead measurement of the output voltage is performed outside these time windows. During the time windows t2-t1 and t4-t3, a voltage sensor can be used to sample the output voltage $V_{out}=IR+V_{BEMF}$.

Figure 5:
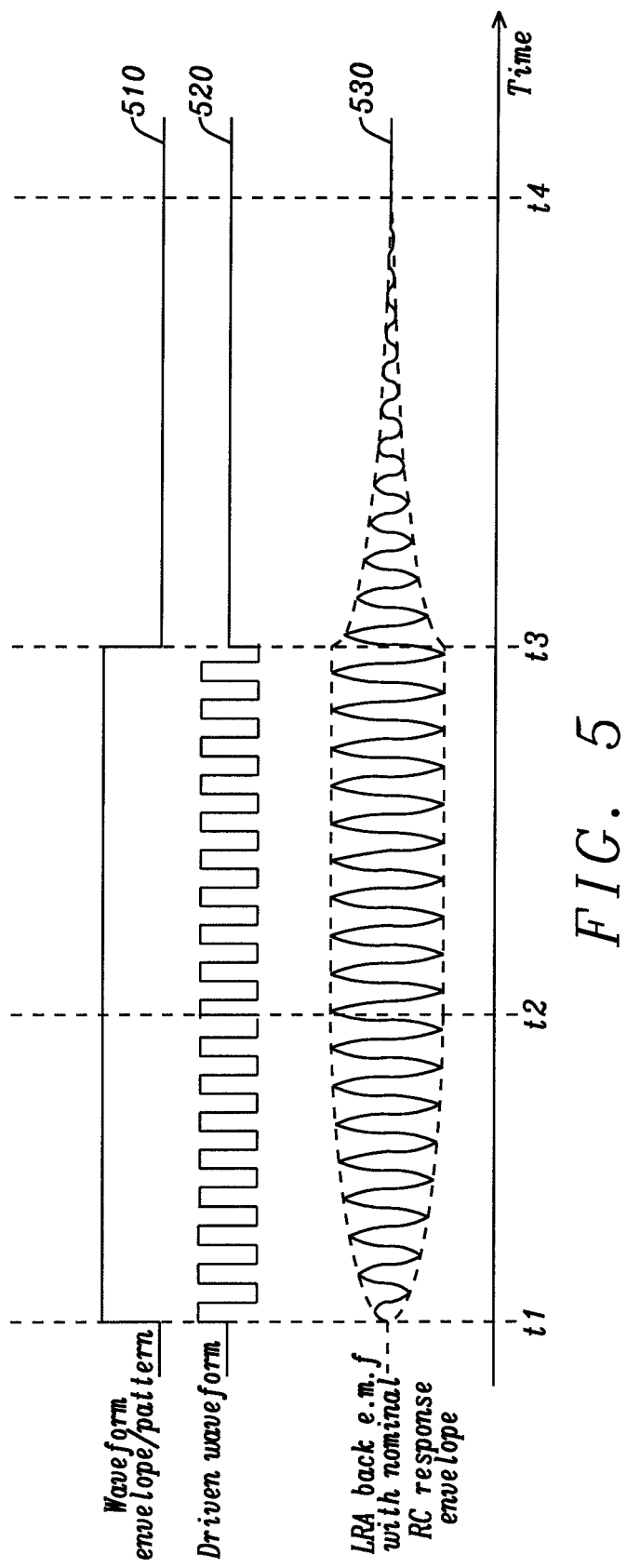
FIG. 5 is a time chart illustrating the waveforms of an envelope signal, a drive signal and a back electromotive force, BEMF, signal.

FIG. 5 illustrates the waveforms of an envelope signal 510; a drive signal 520 and a BEMF signal 530. The envelop signal 510 generated by the envelope generator 112 modulates the amplitude of the drive signal 520. In this example the drive signal is turned on at time t1 and turned off at time t3.

The BEMF signal 530 is modulated by a response envelope. After time t1, the BEMF signal 530 starts increasing gradually, to reach a maximum target amplitude at time t2. Between times t2 and t3 the maximum amplitude of the BEMF signal remains constant. At time t3 the amplitude of the BEMF signal starts decreasing to reach its minimum target value at time t4. The envelope signal can be used to generate an overdrive in order to accelerate or decelerate the oscillating mass of the LRA to provide the desired user feedback.

FIG. 6 illustrates how the response of the LRA varies for different envelope signals corresponding to different sequences of overdrive.

FIG. 6a shows the waveform of a first envelope signal 610 and the corresponding BEMF signal 620. In this example the envelop signal 610 provides an ideal overdrive control. Between the times t1 and t2, the amplitude of the envelope signal is above a target value. The target value may be a level of drive set by the user. For example, the user sets a target value of 1V, and the system drives the device with 1.5V for a short period until the amplitude of the response signal is at 1V. This period of time corresponds to a positive overdrive in which the mass of the LRA is accelerated. At time t2 the amplitude of the envelope is reduced and maintained constant at the target level until time t3. Between the times t2 and t3 there is no acceleration and the velocity of the mass remains constant. At time t3 the amplitude of the envelope signal becomes negative, hence reversing the polarity of the drive signal. This period of time corresponds to a negative overdrive in which the mass of the LRA is decelerated. This is illustrated by the decreasing amplitude of the BEMF signal 620. At time t4a the amplitude of the envelope signal is null, and the mass of the LRA is at rest with no velocity. In this example, the time period corresponding to the negative overdrive between t3 and t4a lasts just long enough to stop the motion of the mass at the point when the overdrive signal is not applied. In other word the negative overdrive time has been applied for a precise duration in order to achieved the desired effect.

FIG. 6b shows the waveform of a second envelope signal 630 and the corresponding BEMF signal 640. In this example, the envelop signal 630 provides a negative overdrive time between t3 and t4b that is too short to produce the desired effect. As a result, the motion of the mass carries on for a certain duration after the negative overdrive has cessed to be applied. At time t4a the mass is still in motion and only stops moving at time t5.

FIG. 6c shows the waveform of a third envelope signal 650 and the corresponding BEMF signal 660. In this example, the envelop signal 650 provides an excessive overdrive time. In this example the time period corresponding to the negative overdrive between t3 and t4c is too long. As a result, the motion of the mass stops at time t4a but then starts moving again after that time. Between times t4a and t4c, the mass is oscillating in an opposite direction (opposing phase). After time t4c, the mass slows down again and stops moving at time t6.

Figure 7:
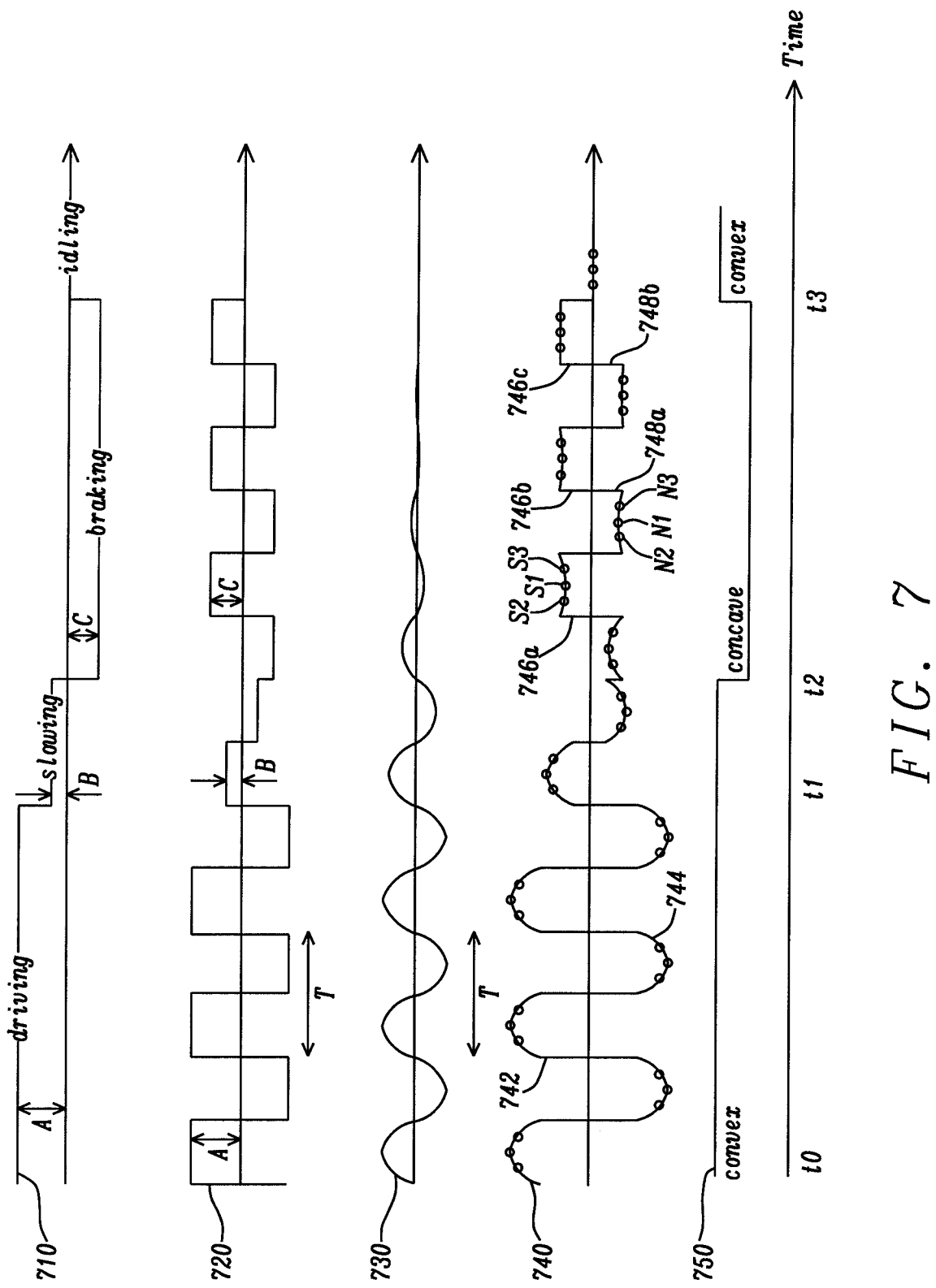
FIG. 7 is a time chart illustrating the working of the system of FIG. 1 as it changes from maintaining an oscillation to stopping the oscillation.

FIG. 7 illustrates the waveforms of an envelope signal 710, a drive signal 720, a BEMF signal 730, a combined drive and BEMF signal 740, and a curvature state indicator 750. In this example the haptic system is locked in frequency, for example at the resonance frequency of the LRA.

The haptic system is operating in three phases denoted as first, second and third phase. In the first phase also referred to as driving phase, the drive signal is used to maintain the velocity of the mass. In the second phase also referred to as braking phase, the drive signal is used to stop the motion of the mass by driving the LRA in reverse. In the third phase also referred to as idling phase, no drive signal is being applied. The system may also be operated in a forth intermediate phase in which the amplitude of the drive signal is reduced.

Between the times t0 and t1, the haptic system is in the driving phase. During this time the amplitude of the envelope signal 710 has a first value A. In this example the drive signal 720 is a square wave signal of amplitude A and frequency F corresponding to the resonance frequency of the LRA. The drive signal 720 changes polarity every half-cycles, alternating between a positive value and a negative value. The BEMF signal 730 is in phase with the drive signal. The combined drive and BEMF signal 740, also referred to as system waveform includes a plurality of cycles associated with a period T. Each cycle has a positive half-cycle 742 and a negative half-cycle 744. The positive half-cycle 742 has a convex outer shape section corresponding to a positive curvature.

Between the times t1 and t2, the haptic system is in the intermediate phase, in which the amplitude of the drive signal 720 has decreased to a value B lower than A. The BEMF signal 730 is still in phase with the drive signal. The combined drive and BEMF signal 740, decreases in amplitude. This phase is optional.

At time t2 the polarity of the drive signal is inverted to brake the LRA. This can be achieved by swapping the positive and negative signals across the LRA. For example, the reversing of the drive signal can be achieved using a H-bridge driver with the LRA load between the two branches of the driver. The phase of the carrier signal is reversed and the amplitude of the envelope signal is −C. At this point in time the LRA is driven in reverse, and the system waveform has a shape that changes from convex (positive curvature) to concave (negative curvature).

Between the times t2 and t3, the haptic system is in the active breaking phase. The BEMF signal 730 is out of phase with the drive signal 720. The combined drive and BEMF signal 740, has an upper portion 746 (746a, 746b, 746c) and a lower portion 748 (748a, 748b) for each period T. The upper portion 746 has a concave outer shape section corresponding to a negative curvature. However, over time the degree of concavity of the upper portion decreases. In other word, the upper portion has a concave outer shape section which becomes less and less concave. This is illustrated by the three upper portions 746a, 746b and 746c. The upper portion 746a has a section that is more concave than the corresponding section of the upper portion 746b. The upper portion 746c has a section that is substantially flat, corresponding to a zero curvature. At time t3 the amplitude of the envelope signal 710 is reduced to zero. As a result, the driving signal is null and the haptic system enters the idling phase.

Therefore, as the LRA decelerates the system waveform 740 becomes less concave until it becomes flat and changes back to being convex as it starts to accelerate again. By monitoring the change in the sign of curvature, the end of the braking-point can be determined. The sign of curvature may be detected in both the positive and the negative half-cycle of the waveform.

The shape of the system waveform 740 can be identified by monitoring and comparing a plurality of sample points on the waveform. In an exemplary embodiment three sample points are monitored and used to determine whether the waveform is concave or convex. For instance, a first point S1 is chosen at or near the middle of the positive half-cycle of the waveform, a second point S2 is chosen before S1, and a third point S3 is chosen after S1. The sample points S1, S2 and S3 have an amplitude A1, A2 and A3 respectively.

The curvature of the system waveform can be determined by comparing the amplitude of the three points S1, S2 and S3. In the positive half-cycle 746 of the system waveform, if A2−A1>0 and A1−A3<0, then the system waveform has a concave shape. However, if A2−A1<0 and A1−A3>0, then system waveform has a convex shape. The shape concave or convex of the curvature may be determined by the calculator 122 and the comparator 124.

Similarly, it is possible to choose three sample points N1, N2 and N3, having an amplitude B1, B2 and B3 on the negative half-cycle of the system waveform. In the negative half-cycle 748 of the system waveform, if B2−B1<0 and B1−B3>0, then the system waveform has a concave shape. However, if B2−B1>0 and B1−B3<0, then system waveform has a convex shape.

In this example three points are monitored and compared for each and every half-period of the system waveform. However, the sampling rate can be varied as required. For example, the sample points could be monitored and compared for example every second period. The number of points being monitored can also be adjusted. For example, the number of points may be at least three or greater than three. The larger the number of points being monitored the greater the precision of the system. In addition, when the sample points are chosen within a small range, a minimum amplitude threshold may be used in order to select the sampling points.

Therefore, the proposed method and system uses the sinusoidal nature of the BEMF signal together with the driving signal to monitor when the combined waveform changes from concave to convex. At this point the LRA has just stopped. This mechanism is independent of any analogue offsets or driving levels since it is based on the comparison of relative points on the system waveform.

The slowing intermediate phase is optional. The active breaking may be applied directly. For example, the positive and negative signals across the LRA are swapped and the amplitude level may be maintained. This provides a strong braking but one that is proportionate to the current driving level.

Oscillating devices are generally operated with a frequency that is characteristic of the device. Depending on the conditions, this frequency may drift for example as a function of temperature, external load conditions, or time. For this reason, it may be necessary to use a control system capable of tracking the operation frequency of the device.

Figure 8:
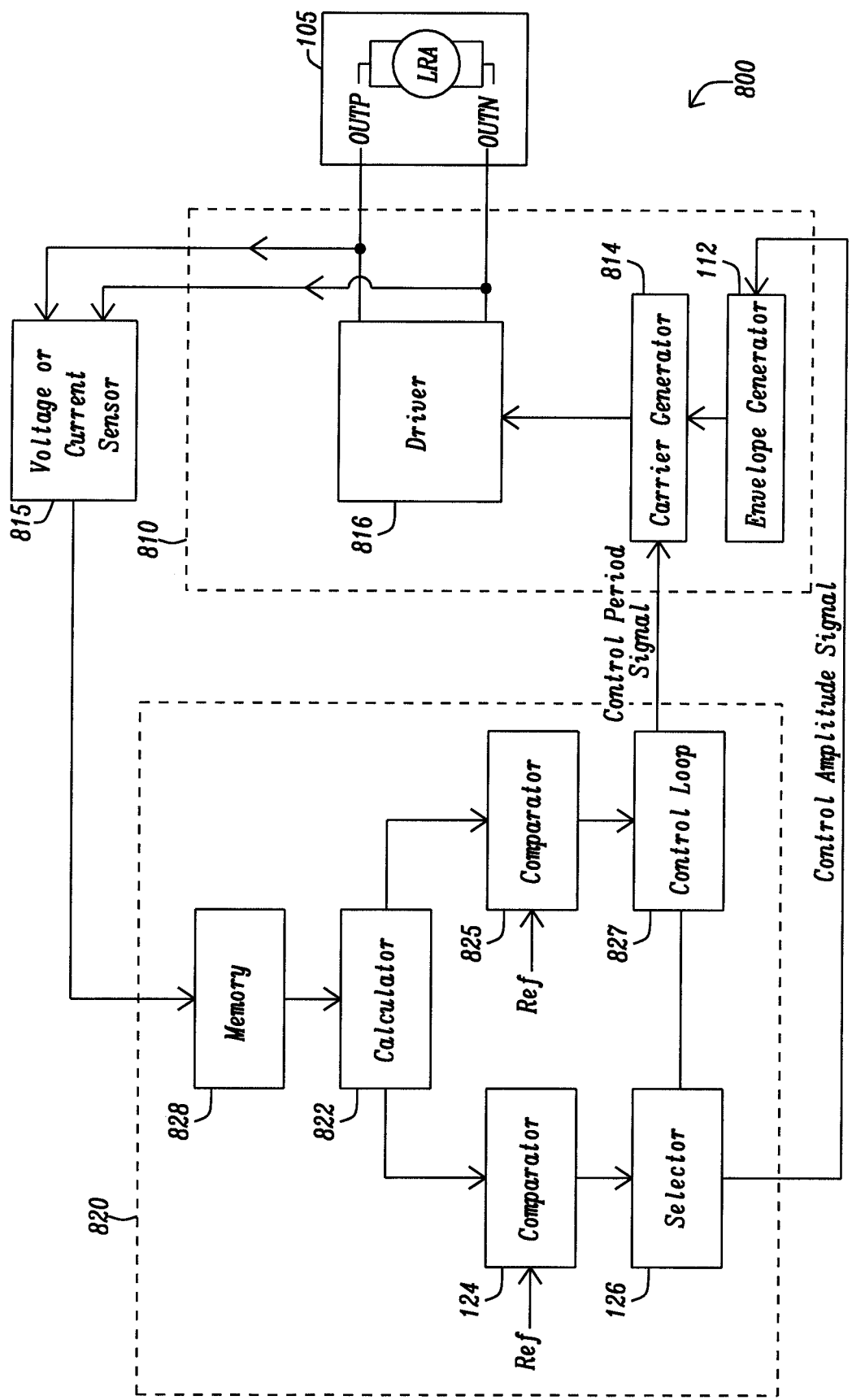
FIG. 8 is a diagram of a haptic system provided with a frequency tracker.

FIG. 8 illustrates another haptic system 800. The haptic system 800 is similar to haptic system 100 of FIG. 1, in which certain parts of the circuit have been added or modified. Other components have reference numerals as indicted above and shown in FIG. 1. For the sake of brevity, the description of these common components will not be repeated.

In this example, the controller 820 is provided with a frequency controller to track a frequency of operation of a haptic actuator, in this case a LRA. The frequency controller includes a memory 828, a calculator 822, a comparator 825 and a control loop 827.

The memory 828 has an input for receiving an electric parameter value from the sensor 815, and an output coupled to the calculator 822. The calculator 822 may be a slope calculator to calculate a slope or gradient between two points. The calculator 822 has an input for receiving measurement values from the memory 828 and two outputs: a first output for providing a first calculated value to the comparator 124; and a second output for providing a second calculated value to the comparator 825. The second calculated value may be a difference value or a slope value.

The comparator 825 has a first input for receiving the second calculated value from the calculator 822, a second input for receiving a target value and an output for providing an error signal.

The control loop 827 has an input for receiving the error signal from the comparator 825 and an output for providing a control signal to the carrier generator 114. The control signal may include a period parameter to change the period of the signal generated by the carrier generator 114.

The control loop 827 is coupled to the selector 126. For example, the control loop 827 may provide a signal indicating that the drive signal is frequency locked with the response signal. frequency value of the response signal to the selector 126. Similarly, the selector 126 may provide an amplitude level to normalise the measurements obtained from the sensor. The control loop 827 may be implemented as a phase-lock loop PLL, or a frequency-lock loop FLL or a delay-lock loop DLL, either in analog or digital form.

The carrier generator 814 may be coupled to the comparator 124 (connection not shown) to provide a signal to the comparator to allow inversion of the calculations comparisons when the drive phase is the negative half-cycle.

The regulator 810 comprises an envelope generator 112, a carrier generator 814 and a driver 816. The carrier generator 814 has an input for receiving a control signal from the control loop 827. The carrier generator 814 may be adapted to behave like a digital PLL by varying its period in accordance with the output from the control loop 827. The driver 816 may be implemented as an H-bridge driver to provide a current or a voltage across the haptic device, represented in this example as an LRA.

Figure 9:
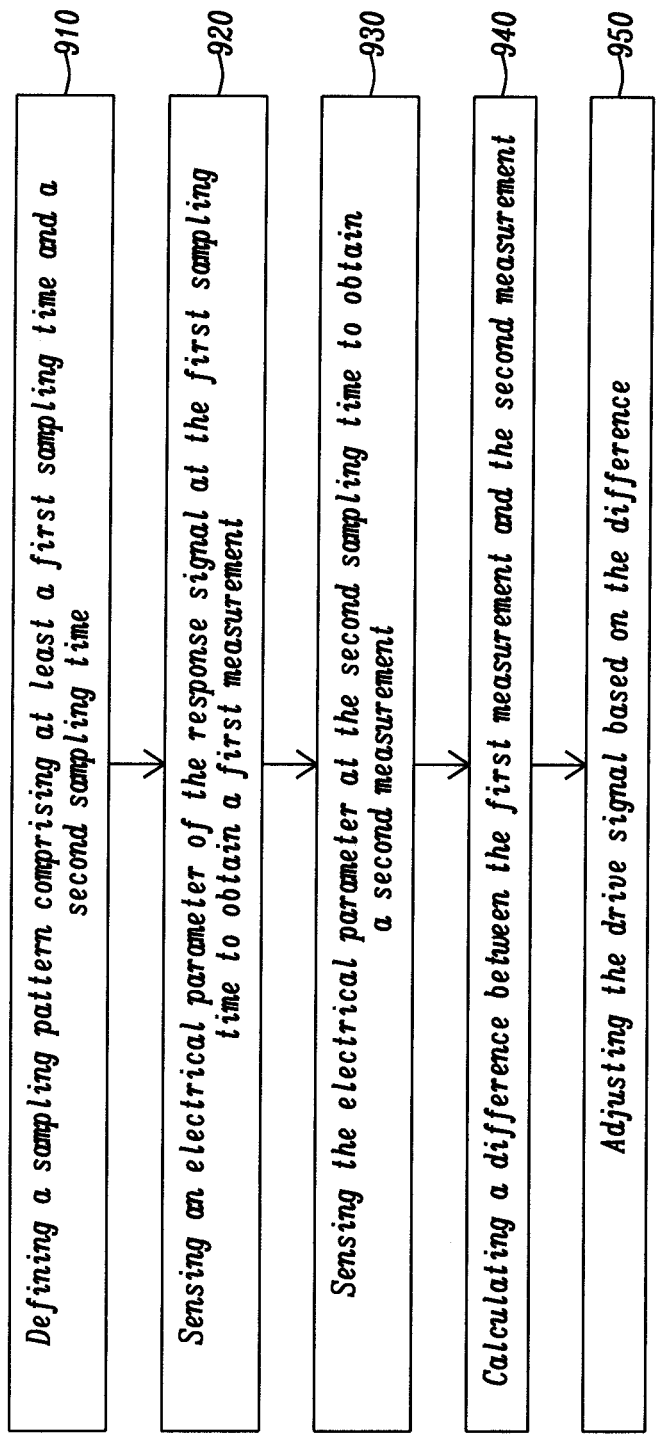
FIG. 9 is a flow diagram of a method of tracking a frequency of operation of an oscillating device.

FIG. 9 is a flow diagram of a method for controlling the frequency of a haptic actuator using the system of FIG. 8.

At step 910, a sampling pattern is defined that includes at least a first sampling time and a second sampling time. For example, the sampling pattern may be defined such that when the response signal and the drive signal have a same frequency and are in phase, then a measurement of the response signal obtained at the first sampling time is equal to another measurement of the response signal obtained at the second sampling time.

At step 920 an electrical parameter of the response signal such as a current value or a voltage value, is sensed by the sensor 115 at the first sampling time to obtain a first measurement. At step 930 the electrical parameter is sensed by the sensor 115 at the second sampling time to obtain a second measurement. The measurements may be stored in the memory 828.

At step 940, a difference between the first measurement and the second measurement is calculated by the calculator 822. The calculator 122 can retrieve the measurement from the memory 828 in order to perform its calculation.

At step 950 the drive signal is adjusted based on the difference. For instance, the drive frequency of the drive signal may be varied to reduce the difference between the first measurement and the second measurement. For example, the calculator 822 can provide a difference value to the comparator 825. The comparator 825 then compares the difference value with a target value and provides an error signal to the control loop 827. The control loop 827 then provides a control signal to the carrier generator 114.

The operating frequency of the haptic device can be tracked using at least one pair of measurements within a period T corresponding to a cycle of the response signal. The pair of measurements can be monitored at different rates. For example, the pair of measurements may be monitored for every half-cycle of the response signal. Alternatively, the pair of measurements may be monitored for every N half-cycles of the response signal, in which N is an integer greater than one. Using this approach, it is possible to operate the haptic device at its resonance frequency using a relatively simple system.

A skilled person will appreciate that variations of the disclosed arrangements are possible without departing from the disclosure. Although the system of the disclosure has been described with respect to haptic actuators such as LRA, the system could also be used with other types of oscillating devices. For example, the system could be used with a speaker. Accordingly, the above description of the specific embodiment is made by way of example only and not for the purposes of limitation. It will be clear to the skilled person that minor modifications may be made without significant changes to the operation described.

What is claimed is:

1. A control system for use with an oscillating device comprising a response signal having a back electromotive force component, the control system comprising
a driver adapted to provide a drive signal to the oscillating device; wherein the drive signal comprises an amplitude and a polarity;
a sensor adapted to sense an electrical parameter of the response signal; and
a controller coupled to the sensor and to the driver, the controller comprising a calculator adapted to determine a sign of curvature of a curved portion of the back electromotive force component of the response signal based on the electrical parameter; the controller being adapted to provide a control signal to adjust the amplitude of the drive signal to slow down the oscillating device, wherein upon reversing the polarity of the drive signal the curved portion gradually flattens before changing its sign of curvature and wherein the controller is adapted to withdraw the drive signal upon identifying the change in the sign of curvature of the curved portion of the back electromotive force component.

2. The control system as claimed in claim 1, wherein identifying a change in the sign of curvature comprises identifying a change from a negative curvature to a positive curvature.

3. The control system as claimed in claim 1, wherein identifying a change in the sign of curvature comprises identifying that the curved portion of the back electromotive force component of the response signal has a zero curvature.

4. The control system as claimed in claim 1,
wherein the sensor is adapted to sense the electrical parameter at a plurality of sampling times associated with a sampling pattern to obtain a first measurement, a second measurement and a third measurement; and
wherein the calculator is adapted to compare the second and third measurements with the first measurement, and to determine the sign of curvature based on the comparison.

5. The control system as claimed in claim 4, wherein the oscillating device comprises a resonance frequency, the control system comprising a frequency controller adapted to adjust the drive signal to drive the oscillating device at the resonance frequency.

6. The control system as claimed in claim 1, wherein the driver is a current driver to provide a current signal, and wherein the sensor is a voltage sensor to sense a voltage across the oscillating device.

7. A method of controlling an oscillating device adapted to provide a response signal comprising a back electromotive force component, the method comprising
providing a drive signal to drive the oscillating device, wherein the drive signal comprises an amplitude and a polarity;
sensing an electrical parameter of the response signal;
adjusting the amplitude of the drive signal to reverse its polarity and slow down the oscillating device;
determining a sign of curvature of a curved portion of the back electromotive force component of the response signal based on the electrical parameter; wherein upon reversing the polarity of the drive signal the curved portion gradually flattens before changing its sign of curvature and
withdrawing the drive signal upon identifying the change in the sign of curvature of the curved portion of the back electromotive force component.

8. The method as claimed in claim 7, wherein identifying a change in the sign of curvature comprises identifying a change from a negative curvature to a positive curvature.

9. The method as claimed in claim 7, wherein identifying a change in the sign of curvature comprises identifying that the curved portion of the back electromotive force component of the response signal has a zero curvature.

10. The method as claimed in claim 7, wherein determining the sign of curvature comprises
sensing the electrical parameter at a plurality of sampling times to obtain a first measurement, a second measurement and a third measurement;
comparing the second and third measurements with the first measurement; and
determining the sign of curvature based on the comparison.

11. The method as claimed in claim 7, wherein the oscillating device comprises a resonance frequency, the method comprising adjusting the drive signal to drive the oscillating device at the resonance frequency.

12. The method as claimed in claim 7, wherein the drive signal is a current signal and wherein the electrical parameter is a voltage.

13. An oscillating device system comprising
an oscillating device comprising a response signal having a back electromotive force component, and
a control system, the control system comprising
a driver adapted to provide a drive signal to the oscillating device; wherein the drive signal comprises an amplitude and a polarity;
a sensor adapted to sense an electrical parameter of the response signal; and
a controller coupled to the sensor and to the driver, the controller comprising a calculator adapted to determine a sign of curvature of a curved portion of the back electromotive force component of the response signal based on the electrical parameter; the controller being adapted to provide a control signal to adjust the amplitude of the drive signal to reverse its polarity and slow down the oscillating device, wherein upon reversing the polarity of the drive signal the curved portion gradually flattens before changing its sign of curvature; the controller being adapted to withdraw the drive signal upon identifying the change in the sign of curvature of the curved portion of the back electromotive force component.

14. A mobile device comprising an oscillating device system; the oscillating device system comprising
an oscillating device comprising a response signal having a back electromotive force component, and
a control system, the control system comprising
a driver adapted to provide a drive signal to the oscillating device; wherein the drive signal comprises an amplitude and a polarity;
a sensor adapted to sense an electrical parameter of the response signal; and
a controller coupled to the sensor and to the driver, the controller comprising a calculator adapted to determine a sign of curvature of a portion of the back electromotive force component of the response signal based on the electrical parameter; the controller being adapted to provide a control signal to adjust the amplitude of the drive signal to reverse its polarity and slow down the oscillating device, wherein upon reversing the polarity of the drive signal the curved portion gradually flattens before changing its sign of curvature; the controller being adapted to withdraw the drive signal upon identifying the change in the sign of curvature of the curved portion of the back electromotive force component.

15. A controller for use with a driver for providing a drive signal to an oscillating device, and a sensor for sensing an electrical parameter of a response signal of the oscillating device, wherein the drive signal comprises an amplitude and polarity, and wherein the response signal comprises a back electromotive force component; the controller comprising a calculator adapted to determine a sign of curvature of a curved portion of the back electromotive force component of the response signal based on the electrical parameter; the controller being adapted to provide a control signal to adjust the amplitude of the drive signal to reverse its polarity and slow down the oscillating device, wherein upon reversing the polarity of the drive signal the curved portion gradually flattens before changing its sign of curvature, the controller being adapted to withdraw the drive signal upon identifying the change in the sign of curvature of the curved portion of the back electromotive force component.

16. The controller as claimed in claim 15, wherein identifying a change in the sign of curvature comprises identifying a change from a negative curvature to a positive curvature.

17. The controller as claimed in claim 15, wherein identifying a change in the sign of curvature comprises identifying that the curved portion of the back electromotive force component of the response signal has a zero curvature.

18. The controller as claimed in claim 15, wherein the calculator is adapted to receive a first measurement, a second measurement and a third measurement of the electrical parameter; wherein the measurements are obtained at a plurality of sampling times; and wherein the calculator is adapted to compare the second and third measurements with the first measurement and to determine the sign of curvature based on the comparison.

19. The controller as claimed in claim 15, comprising a selector coupled to the calculator, for selecting a level of the drive signal.

* * * * *